(12) United States Patent
Kiyokawa et al.

(10) Patent No.: US 6,515,465 B2
(45) Date of Patent: Feb. 4, 2003

(54) METHOD AND APPARATUS FOR MEASURING HARMONIC LOAD-PULL FOR FREQUENCY MULTIPLICATION

(75) Inventors: Masahiro Kiyokawa, Tokyo (JP); Toshiaki Matsui, Tokyo (JP)

(73) Assignee: Communications Research Laboratory, Independant Administration Institution, Koganei (JP)

(*) Notice: Subject to any disclaimer, the term of this patent is extended or adjusted under 35 U.S.C. 154(b) by 0 days.

(21) Appl. No.: 09/813,995

(22) Filed: Mar. 22, 2001

(65) Prior Publication Data

US 2001/0024117 A1 Sep. 27, 2001

(30) Foreign Application Priority Data

Mar. 22, 2000 (JP) ........................................ 2000-080839
Jan. 16, 2001 (JP) ........................................ 2000-008064

(51) Int. Cl.[7] .............................................. G01R 23/00
(52) U.S. Cl. ..................... 324/76.49; 324/642; 333/248
(58) Field of Search ........................ 324/76.49, 76.11, 324/76.51, 76.56, 642, 629, 637, 652, 727; 333/248

(56) References Cited

U.S. PATENT DOCUMENTS 6,297,649 B1 * 10/2001 Tsironis ..................... 324/642

FOREIGN PATENT DOCUMENTS

JP  11-6855  1/1999

OTHER PUBLICATIONS

Masahiro Kiyokawa, et al., "Harmonic Load–Pull For Frequency Multiplication Using Stub–Probe Loaded Tuners," Proceedings of the 2000 Electronics Society Conference of IEICE, Sep. 30–Oct. 3, 2000, p. 65.

* cited by examiner

*Primary Examiner*—Christine Oda
*Assistant Examiner*—Amy He
(74) *Attorney, Agent, or Firm*—Oblon, Spivak, McClelland, Maier & Neustadt, P.C.

(57) ABSTRACT

A method for measuring harmonic load-pull including supplying a fundamental frequency signal to a frequency multiplication device under test and obtaining a target even-order multiplied frequency signal. The fundamental load impedance and an even-harmonic load impedance are independently controlled with a load mechanical tuner having an open-ended stub that is one-quarter wavelength long at the fundamental frequency and satisfies a short-circuit condition with respect to the fundamental signal. A fundamental source impedance and an even-harmonic source impedance of an input signal applied to the device under test are independently controlled with a source mechanical tuner having a short-circuit stub that is one-quarter wavelength long at the fundamental frequency and satisfies a short-circuit condition with respect to even-harmonics.

4 Claims, 12 Drawing Sheets

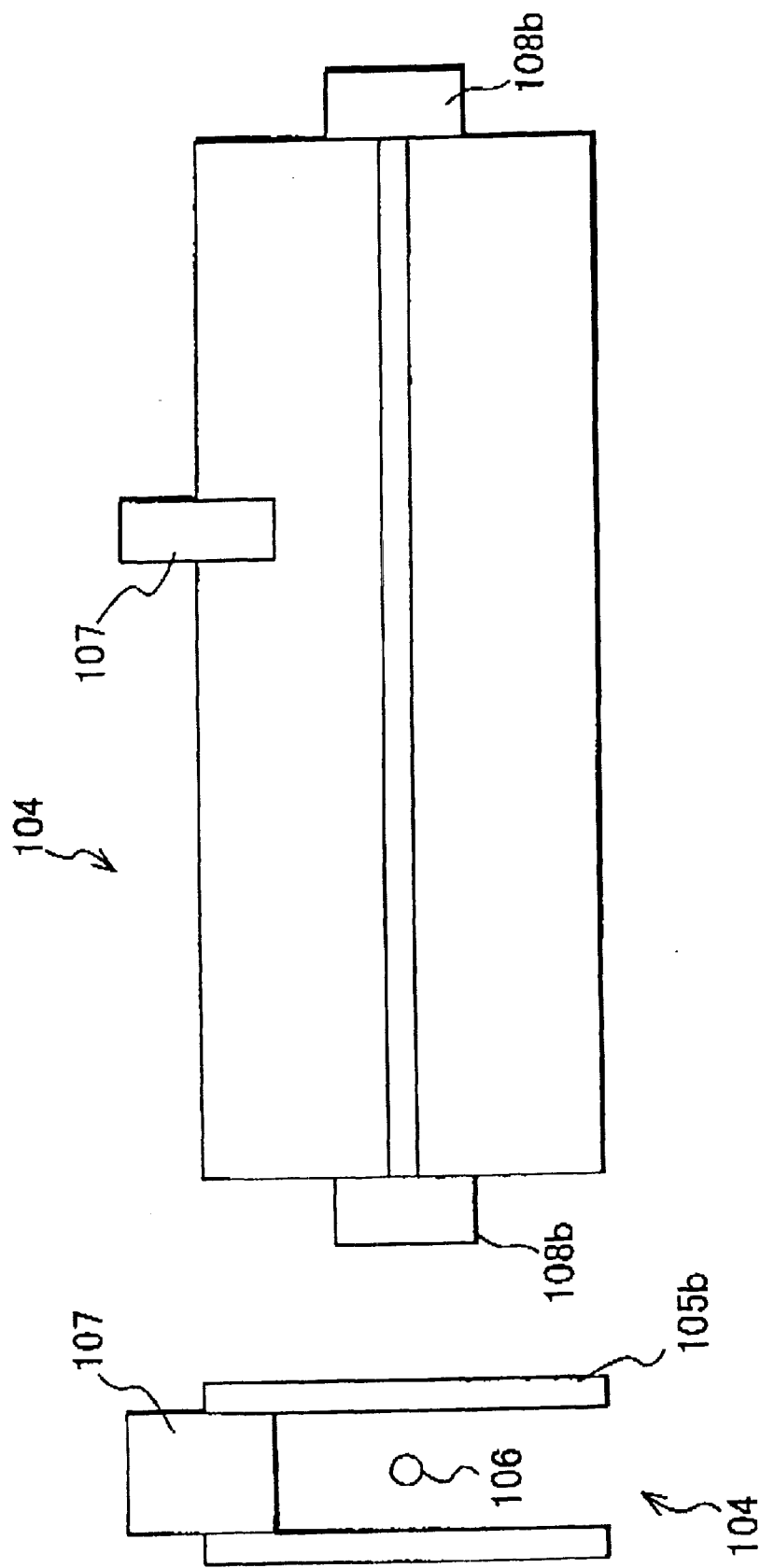

METHOD AND APPARATUS FOR MEASURING HARMONIC LOAD-PULL FOR FREQUENCY MULTIPLICATION

BACKGROUND OF THE INVENTION

1. Field of the Invention

The present invention relates to a measurement method for obtaining harmonic load-pull data for frequency multiplication by mechanically controlling the input/output impedances of transistors or diodes or other such devices having a frequency multiplication function and directly measuring the conditions at which output power, conversion efficiency and other such characteristics are optimal with respect to the target multiplication signal, and to an apparatus using the method.

2. Description of the Prior Art

In recent years there has been considerable research and development into high data rate Ka-band wireless communications systems. One of the issues is securing highly stabilized, low phase noise signal sources that are required for practical digital radio systems using, for example, BPSK, QPSK, or 16QAM Phase-locked oscillators (PLOs) are mentioned as a promising candidate From the standpoints of cost, power consumption, and phase noise, instead of direct phase locking of millimeter-wave oscillators, the use of a microwave PLO followed by one or multiple frequency multipliers is considered to be an effective approach. The operation of a frequency multiplier is based on device nonlinearity, and in most cases, multiplier design has been performed using large-signal device modeling on a microwave circuit simulator. The accuracy of the device modeling, however, has often been insufficient with respect to class B operation, which is extensively used as the operating point of frequency multipliers.

Load-pull (source-pull with respect to the signal source) is known as an alternative approach to device modeling. This method consists in connecting a tuner to the input or output of the device terminal, or a pair of tuners to the input and output of the device terms respectively, and adjusting the tuner impedance(s) while measuring them to find directly the optimum impedance(s) in terms of output power, gain, and so forth. Load-pull has been employed mainly for characterizing high power devices and in the designing of high power amplifiers. Mechanical tuners are used for performing relatively straightforward load-pull measurements, and more recently, automatic tuners are commercially available that enable accurate measurements in a short time.

FIG. 13 shows a conventional load-pull measurement system using mechanical tuners. In load-pull measurement system 100, a pair of mechanical tuners are connected to source measurement system 102 and load measurement system 103 of the device under test (DUT) 101, respectively. The impedances are mechanically varied at the target frequency to establish the conditions under which, for actual input/output signal levels, impedance matching is performed, to optimize output power and gain, etc.

FIG. 14 shows a configuration of a typical coaxial mechanical tuner, called a slug tuner. This is configured as a slabline, with a center conductor 106 arranged at a central position between a pair of parallel, opposed ground planes 105*a* and 105*b*. FIG. 14(*a*) shows a cross section perpendicular to the slabline, and FIG. 14(*b*) shows a cross section parallel to the slabline. With a metallic slug 107 inserted down into the slabline, arbitrary impedances are generated by adjusting the position of the slug 107 horizontally and vertically with respect to the slabline. Signals are input to the tuner via an input coaxial terminal 108*a*, and are output via an output coaxial terminal 108*b*.

The electrical angle from the output terminal of the DUT 101 is varied by adjusting the horizontal distance from the input terminal 108*a* to the slug 107. The absolute value of the reflection coefficient corresponding to the load impedance observed from the output terminal of the DUT 101 is varied by adjusting the vertical distance from the center conductor 106 to the slug 107. A short-circuit condition (reflection coefficient absolute value of 1) is effected by bringing the slug 107 into proximity of the center conductor 106; conversely, by increasing the distance between the slug 107 and the center conductor 106, it is possible to minimize the effect on the electromagnetic field of the transmission line, enabling an impedance of 50 ohms (reflection coefficient absolute value of 0) Since a DUT cannot normally be accessed directly from a coaxial component, a transforming structure is necessary. There are a number of access means, with the transforming structures being referred to as test fixtures.

When a conventional mechanical tuner with one slug is used for measuring harmonic load-pull for frequency multiplication, it is possible to find the load impedance at the target harmonic frequency for which parameters such as multiplication output power are at op levels by carrying out measurements while varying the impedance of the output tuner at the target multiplication frequency. However, with respect to improving the frequency multiplier performances such as conversion gain, not only does the load impedance at the target harmonic frequency ZL (nF0) (where n is the multiplication order) of the output network have to be set, but also the fundamental load impedance ZL (F0) that satisfies the short-circuit condition with a specific electrical angle. That is, although it is known that the performance is improved by optimizing the θ1 in ZL (F0)=j50 Ωtan θ1, in a conventional mechanical tuner, as described above, a short-circuit condition can be realized by setting the slug near the center conductor, so a short circuit with respect to the fundamental signal also formed a short circuit with respect to the multiplication signal, making it impossible to optimize the load impedance at the target harmonic frequency. Moreover, when a given load impedance at the target harmonic frequency is realized by setting the position of the slug, the fundamental load impedance is set at a specific value that is dependent on the slug position setting. Thus, with a prior art mechanical tuner having one slug, it is not possible to independently control the fundamental and harmonic load impedances.

Moreover, frequency multiplier performance is considered to be dependent not only on the fundamental source impedance ZS (F0) of the input circuit, but also on the source impedance at the multiplied frequency. As for frequency doublers, it has been reported that performance is also dependent on the second harmonic source impedance ZS (2F0) that satisfies the short circuit condition with a specific electrical angle, that is, the θ2 in ZS (F0)=j50 Ωtan θ2. That is, it is also desirable to be able to independently control the fundamental and harmonic load impedances in the source mechanical tuner, which is not possible in the case of the single-slug mechanical tuner of the prior art described above.

In order to be able to measure the performance limits of frequency multiplication devices, an object of the present invention is to provide a method for measuring harmonic load-pull for frequency multiplication that, with the fundamental load impedance and the source impedance at the target harmonic frequency each set at an optimal state, enables the target harmonic load impedance and the fundamental source impedance to be individually controlled, respectively, and to provide an apparatus for measuring harmonic load-pull for frequency multiplication using the method.

SUMMARY OF THE INVENTION

To attain the above object, the present invention provides a method for measuring harmonic load-pull for frequency multiplication to obtain a load impedance and a source impedance for which frequency multiplication performance of a frequency multiplication device is optimized, the method comprising;

supplying a fundamental frequency signal to a frequency multiplication device under test (DUT) from a source measurement system that includes a source mechanical tuner for adjusting a fundamental source impedance of an input signal, and obtaining a load impedance at which multiplication performance of the frequency multiplication device is optimum from a load measurement system that includes a load mechanical tuner for adjusting a load impedance of a target even-order multiplied signal among harmonics included in signal output of the frequency multiplication device;

independently controlling the fundamental load impedance and an even-harmonic load impedance by means of a load mechanical tuner that includes a control means that functions as an open-ended stub that is one-quarter wavelength long at the fundamental frequency and which at that position satisfies a short-circuit condition with respect to the fundamental signal, for controlling a fundamental load impedance that in accordance with a position at which the stub is set determines an electrical angle from an output section of a device under test to a short-circuit point;

independently controlling fundamental source impedance and even-harmonic source impedance by means of a source mechanical tuner that includes control means that functions as a short-circuit stub that is one-quarter wavelength long at the fundamental frequency, meaning a half wavelength long at the second harmonic frequency, and which at that position satisfies a short-circuit condition with respect to even harmonics that include a second harmonic signal, for controlling an even-harmonic source impedance that in accordance with a position at which the stub is set determines an electrical angle from an input section of a device under test to the short-circuit point.

The present invention also provides an apparatus for measuring harmonic load-pull for frequency multiplication to obtain a load impedance and a source impedance for which frequency multiplication performance of a frequency multiplication device is optimized, the apparatus comprising:

a source measuring system that supplies a fundamental frequency signal to a DUT from a source measurement system that includes a source mechanical tuner for adjusting a fundamental source impedance of an input signal, and a load measurement system that includes a load mechanical tuner for adjusting a load impedance of a target even-order harmonic signal within a harmonic included in signal output of the frequency multiplication device;

the load mechanical tuner of the load measuring system including control means that functions as an open ended stub that is a quarter wavelength long at the fundamental frequency and which at that position satisfies a short-circuit condition with respect to the fundamental signal and in accordance with a position at which the stub is set determines an electrical angle from an output section of a DUT to a short-circuit point;

the source mechanical tuner of the source measuring system including control means that functions as a short-circuit stub that is a quarter wavelength long at the fundamental frequency, meaning a half wavelength long at the second harmonic frequency, and which at that position satisfies a short-circuit condition with respect to even-harmonic signals that include a second harmonic, for controlling an even-harmonic source impedance that in accordance with a position at which the stub is set determines an electrical angle from an input section of a DUT to a short-circuit point;

the load mechanical tuner being used to independently control the fundamental load impedance and an even-harmonic load impedance, and the source mechanical tuner being used to independently control the fundamental source impedance and an even-harmonic source impedance.

Further features of the invention, its nature and various advantages will be more apparent from the accompanying drawings and following detailed description of the invention.

BRIEF DESCRIPTION OF THE DRAWINGS

FIG. 14 is a schematic for explaining the slabline of a prior art slug tuner.

DESCRIPTION OF THE PREFERRED EMBODIMENTS

Figure 1:
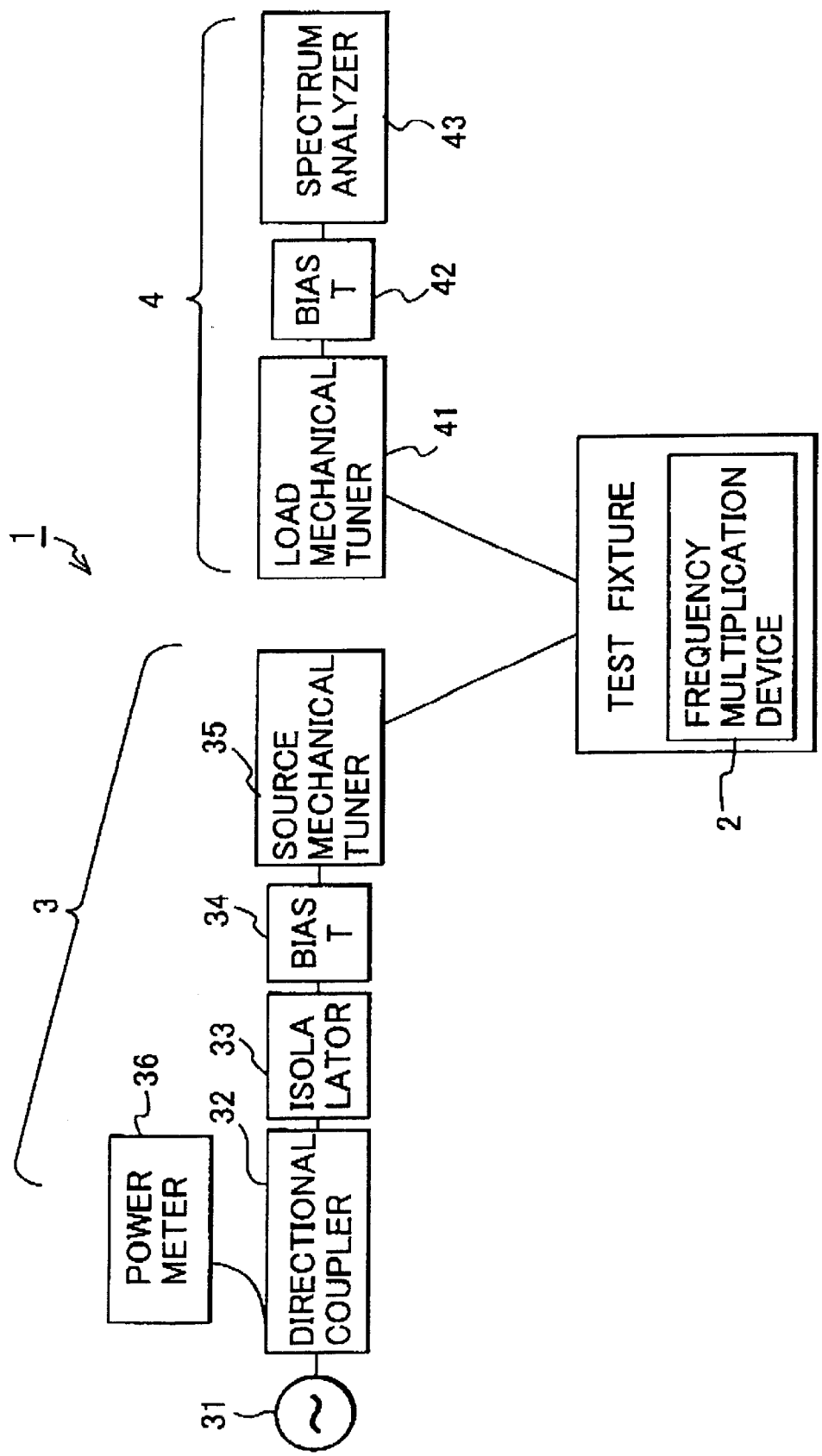
FIG. 1 is a diagram of the overall configuration of an apparatus according to the present invention for measuring harmonic load-pull for frequency multiplication.

Details of embodiments of the present invention will now be explained with reference to the drawings. FIG. 1 shows an apparatus for measuring harmonic toad-pull for frequency multiplication, according to the present invention. The apparatus 1 comprises a source measurement system 3 that supplies a fundamental frequency signal to a frequency multiplication device 2 as the object of the load-pull measurements, and a load measurement system 4 that collects data relating to the frequency multiplication performance.

The system 3 includes a signal source 31, a directional coupler 32, an isolator 33, a bias T 34, and a source mechanical tuner 35. The coupler 32 is for dividing signals from the signal source 31 at a set rate (coupling degree of 20 to 1, for example). A power meter 36 is used to monitor the signal output level from the signal source 31. The isolator 33 isolates the signal source 31 from the effects of wave reflection. The bias T 34 supplies a bias to the input terminal of the device 2. The source mechanical tuner 35 is for adjusting the source impedance for the input fundamental signal.

The load measurement system 4 includes a load mechanical tuner 41 that is able to adjust the load impedance for the harmonic signals output by the device 2, a bias T 42 for supplying a bias to the output terminal of the device 2, and a spectrum analyzer 43. The strum analyzer 43 measures the levels of the multiplied, the fundamental, and undesired harmonic signals generated by the device 2.

In contrast to existing slug tuners, the load mechanical tuner 41 has an open-ended stub probe (a term coined by the present inventors) 50 that functions as a control means, as an open-ended stub that is a quarter wavelength long at the fundamental frequency and which at that position satisfies a short-circuit condition with respect to the fundamental signal, for controlling a fundamental load impedance that in accordance with a position at which the stub is set determines the electrical angle from the output section of the device under test to the short-circuit point.

Figure 2:
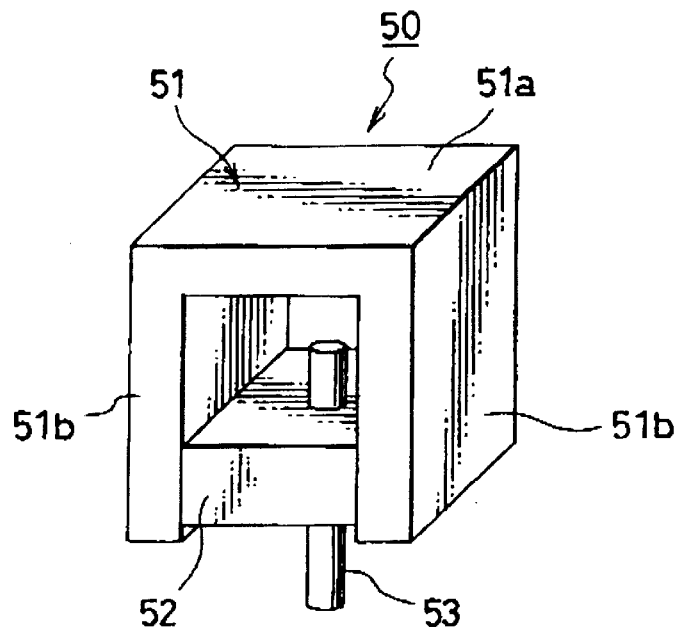
FIG. 2 is a perspective view of an open-ended stub probe used as a fundamental load impedance control means.
Figure 3:
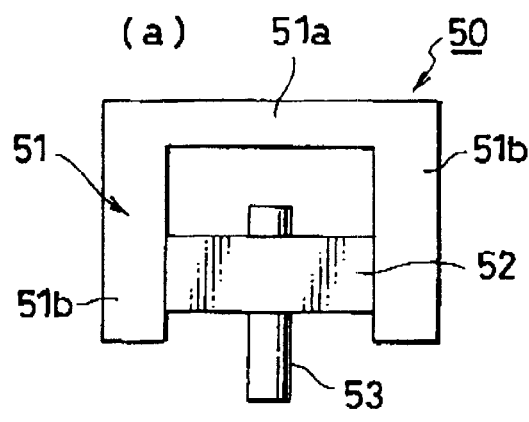
FIG. 3(a) is a side view of an open-ended stub probe and FIG. 3(b) is a side view of a short-circuit stub probe.
Figure 3:
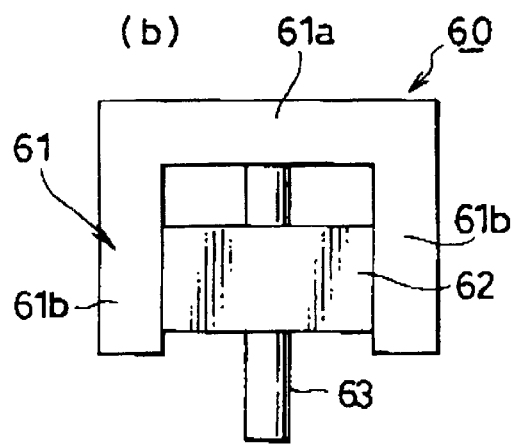

The structure of the open-ended stub probe 50 is shown in FIGS. 2 and 3(a). The stub probe 50 comprises a center conductor 53 supported at a specific position between the sides of the ground conductor 51 by a low-permittivity dielectric 52. That is, in length the center conductor 53 is one quarter wavelength at the fundamental frequency and passes through the low-permittivity dielectric 52, being thereby held in place between the parallel ground conductor plates 51b that extend from the connecting portion 51a in parallel with the center conductor 53, with the upper end of the center conductor 53 not in contact with the ground conductor 51, thus forming an open circuit. The low-permittivity dielectric 52 can be formed of foam resin or Teflon or other such material having a permittivity close to 1 that can stably support the center conductor 53.

Figure 4:
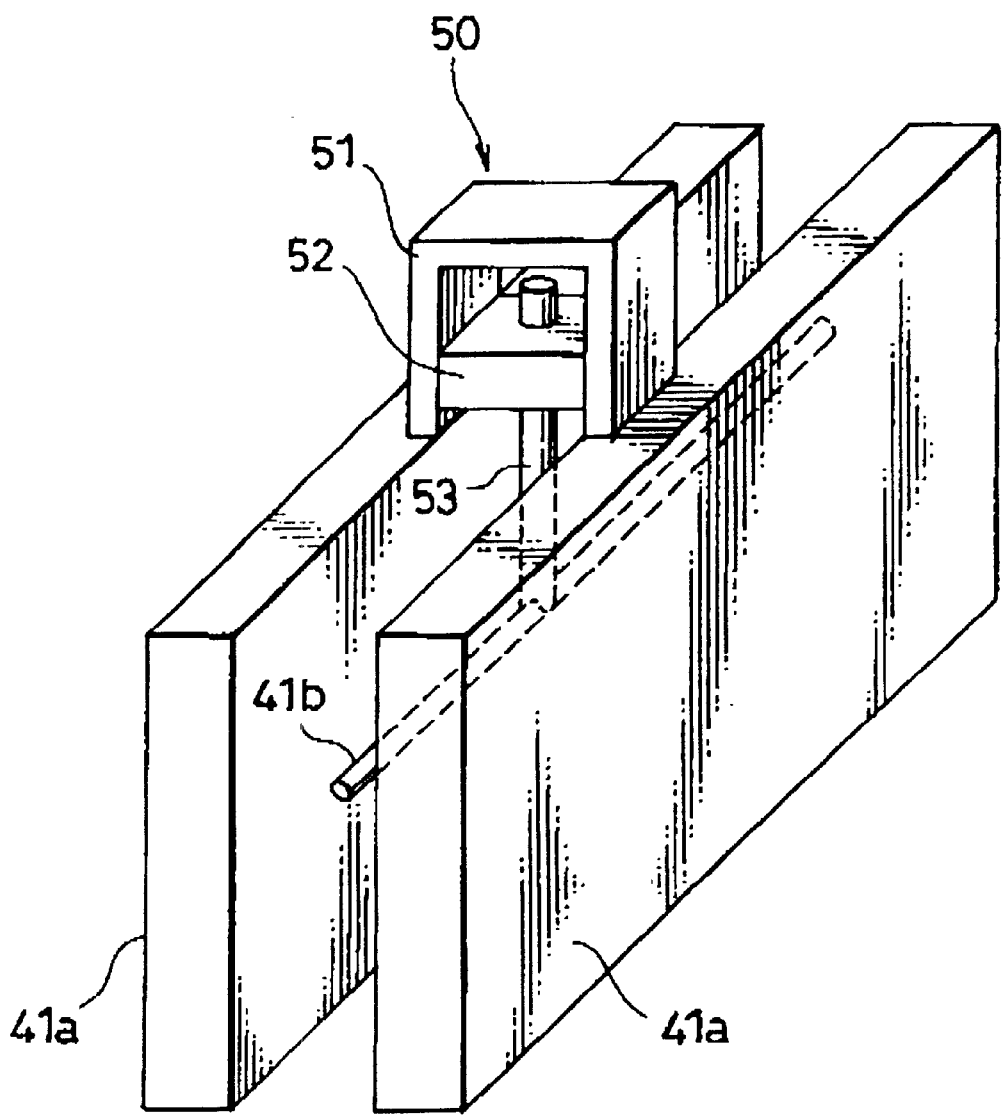
FIG. 4 is a perspective view of a slabline loaded with an open-ended stub probe.

The open-ended stub probe 50 thus configured is arranged with the lower end of the center conductor 53 in electrical contact with the center conductor 41b located between the parallel ground conductor plates 41a of the load mechanical tuner 41, forming a T branch. The portion of the center conductor 53 inside the tuner 41 and the parallel ground conductor plates 41 a together function as a secondary slabline circuit, and the center conductor 53 within the stub probe 50 with the parallel ground conductor plates 51b function as a slabline with an open end. The overall result is the formation of a secondary slabline circuit with an open end FIG. 4). The parallel ground conductor plates 51b are set on the upper edges of the parallel ground conductor plates 41a. The electrical angle from the output terminal of the device 2 to the short-circuit point can be adjusted by sliding the conductor plates 51b along the conductor plates 41a.

Thus, since the stub probe 50 is an open circuit with respect to even harmonics, it can apply a short circuit condition with respect to the fundamental signal without affecting control of the load impedance at the multiplication frequency, and so the short-circuit position at which the fundamental load impedance is optimum can be found by varying the short-circuit position with the stub probe 50.

In contrast to existing slug tuners, the source mechanical tuner 35 has a short-circuit stub probe (a term coined by the present inventors) 60 that functions as a control means, as an open-ended stub that is a quarter wavelength long at the fundamental frequency, meaning a half wavelength at the second harmonic frequency, and which at that position satisfies a short-circuit condition with respect to even-harmonic signals that include a second harmonic, for controlling an even-harmonic source impedance that in accordance with a position at which the stub is set determines an electrical angle from an input section of a device under test to the short-circuit point.

The structure of the above short-circuit stub probe 60 is shown in FIG. 3(b). The stub probe 60 comprises a center conductor 63 supported at a specific position between the sides of the ground conductor 61 by a low-permittivity dielectric 62. That is, in length the center conductor 63 is a quarter wavelength at the fundamental frequency and passes through the low-permittivity dielectric 62, being thereby held in place between the parallel ground conductor plates 61b that extend from the connecting portion 61a in parallel with the center conductor 63, with the upper end of the center conductor 63 in contact with the ground conductor 61, thus forming a short circuit.

The short-circuit stub probe 60 thus configured is arranged with the lower end of the center conductor 63 in electrical contact with the center conductor located between the parallel ground conductor plates of the source mechanical tuner 35, forming a T branch. The parallel ground conductor plates 61b are set on the upper edges of the parallel ground conductor plates 41a The electrical angle from the input terminal of the DUT 2 to the short-circuit point can thus be adjusted by sliding the conductor plates 61b along the conductor plates 41a Thus, since the short-circuit stub probe 60 is open circuit with respect to the fundamental signal, it can apply a short-circuit condition with respect to the even-harmonic signals without affecting control of the fundamental source impedance, thereby enabling the short-circuit position at which the even-harmonic source impedance is optimum to be found by varying the short-circuit position by means of the stub probe 60.

Consequently, in the load mechanical tuner 41, the position of the open-ended stub probe 50 is set to optimize the fundamental load impedance, and in the source mechanical tuner 35 the position of the short-circuit stub probe 60 is set to optimize the even-harmonic source impedance Thus, at the load mechanical tuner 41 multiplication load impedance is controlled by the slug position setting and at the source mechanical tuner 35 the fundamental source impedance is controlled by the slug position setting, thereby enabling high-accuracy device measurement of the harmonic load-pull for frequency multiplication with the reflection of the fundamental wave component on the load side and the even-harmonic components on the source side suppressed.

When the open-ended stub probe 50 and short-circuit stub probe 60 having the above configurations are used, it does give rise to the limitation that evaluation of the characteristics of the device 2 is made only with respect to the even-order frequency multiplication In fact, however, doublers and quadruplers are used more frequently, and with doublers in particular providing the highest conversion efficiency, and therefore being used with the greatest frequency, the ability to measure harmonic load-pull for even-order frequency multiplication is highly significant.

Figure 5:
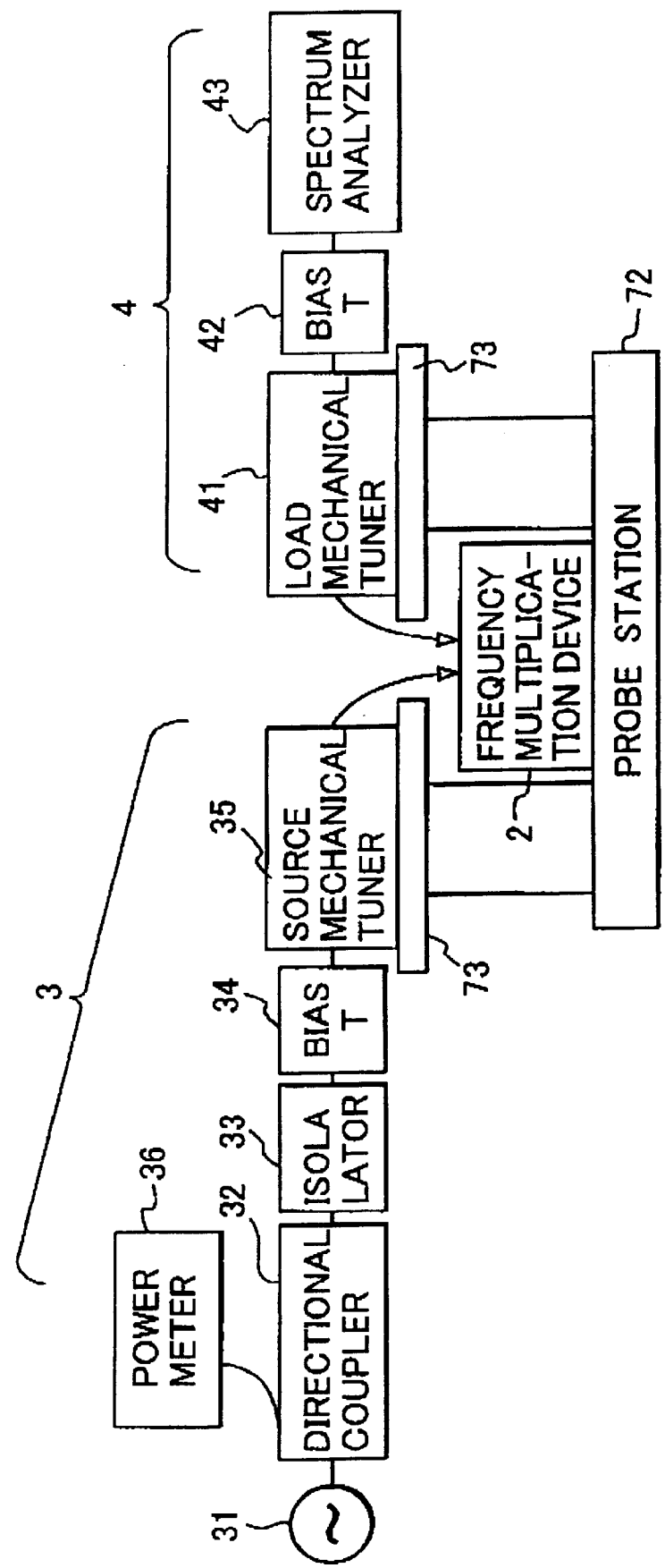
FIG. 5 is a diagram showing the configuration of an embodiment of an apparatus for measuring harmonic load-pull for frequency multiplication.

Next, an example is explained in which source-pull characteristics at a fundamental frequency of a frequency multiplier and load-pull characteristics at an even-harmonic frequency are examined, using the apparatus 1' for measuring harmonic load-pull for frequency multiplication shown in FIG. 5.

For the tuners 35 and 41, automatic tuners were used Focus Microwaves'4006 with a frequency of 6 to 40 GHz). With respect to the test fixture for the DUT 2, RF probes 71 were used to provide access to on-wafer devices. Each mechanical tuner was set on a metal plate 73 attached to a probe station 72, and were connected to the RF probes 71 using semi-rigid high-frequency coaxial cables 74. The probe station 72 was a Summit 9000 made by Cascade Microtech.

Hypothetically arbitrary values of source and load impedances are generated by controlling the tuners 35 and 41. In practice, however, the impedances generated will be limed by the insertion loss between the device 2 and the tuners. Therefore, since it is important to keep the loss to a mum, model 40M pico-probes made by GGB (with an insertion loss of not more than 0.5 dB from DC-40 GHz) were used for the RF probe 71, and 89-0090-KM cables made by Spectrum were used for the cables 74; the length of the cables was kept to the minimum of 9 centimeters.

The bias Ts 34 and 42 used to supply bias to the device under test 2 were located on the outer side of the tuners 35 and 417 relative to the device 2. K250s made by Anritsu Co. were used for the bias Ts 34 and 42. The isolator 33 was an SMI-1316 made by SMT. The directional coupler 32 was a 102040013K (2–40 GHz) with a coupling ratio of −13 dB, made by Krytar.

The device tested was a GaAs PHEMT (gate width of 200 $\mu$m) from Northrop Grumman, biased at its pinch-off Second harmonic signal generated by the device was measured with a spectrum analyzer 43. Insertion loss caused by the tuner 35 varies depending on the impedance generated by the tuner, so the output power level of the signal source 31 was adjusted to provide a constant power input to the device 2.

For the open-ended stub probe 50 loaded in the tuner 41, a block of foamed dielectric material (3.8 mm wide by 7.5 mm deep by 8.0 mm high) with a permittivity of about 1 was used to form the low-permittivity dielectric 52, in which was located a center conductor 53 of copper wire 1.0 mm in diameter and 9.0 mm long, positioned along the center axis of the low-permittivity dielectric 52 The low-permittivity dielectric 52 was held in place between the parallel ground conductor plates 51b, with the gap between the top of the center conductor 53 and the connecting portion 51a being set to about 1 mm. The spacing between the parallel ground conductor plates 5b was 2.3 mm, the same as the spacing between the slabline ground plates of the tuner 41. The open-ended stub probe 50 was fabricated to be a quarter-wavelength long with respect to the fundamental frequency 7.125 GHz, with one end open, to function as a secondary slabline circuit having a characteristic impedance of about 50 ohms.

The tip of the center conductor 53 was machined into a concave shape to ensure that electrical contact was maintained with the slabline center conductor even during horizontal movement of the open-ended stub probe 50. To ensure stable motion of the open-ended stub probe 50, a pair of thin strips were adhered to the top surfaces of the slabline parallel ground conductor plates 41a of the tuner 41, along which the open-ended stub probe 50 could slide.

Figure 6:
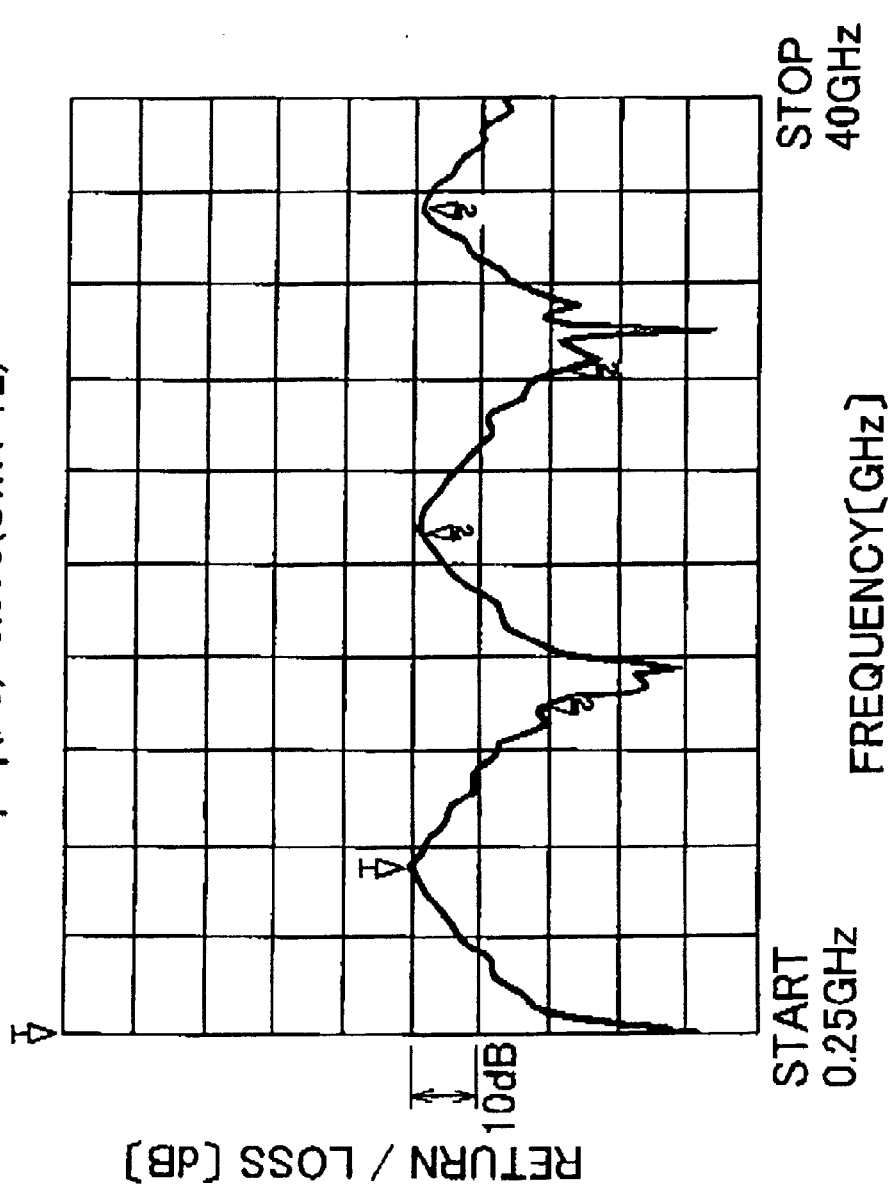
FIG. 6 shows the return loss of a slabline loaded with an open-ended stub probe as a function of frequency.

FIG. 6 shows the return loss characteristics of the slabline loaded with the open-ended stub probe 50 as a function of frequency, measured with a Hewlett-Packard HP8510C vector network analyzer. The absolute value of the reflection coefficient at the fundamental frequency of 7.25 GHz exhibited a high value of 0.973, which is 72 in standing wave ratio. The return loss with respect to the even-harmonic frequencies was suppressed to lower than −20 dB. The results show that the open-ended stub probe 50 thus configured satisfies the short-circuit condition with respect to the fundamental signal, and the open-circuit condition with respect to the even-harmonics, having no affect on the characteristic impedance (50 ohms) of the main slabline. These are good characteristics that are in accordance with the design specifications.

For the short-circuit stub probe 60 used in the source tuner 35, a block of foamed dielectric material having a permittivity of about 1 was used to form the low-permittivity dielectric 62, in which was located a center conductor 63, positioned along the center axis of the low-permittivity dielectric 62. The low-permittivity dielectric 62 was held in place between the parallel ground conductor plates 61b, with the top of the center conductor 63 in contact with the connecting portion 61a, ensuring electrical continuity. The center conductor 63 has a pseudo-elliptical section, with a major axis of 2.0 mm and a minor axis of 1.0 mm, machined from a brass rod 2.0 mm in diameter and 10.2 mm in length This shape enables a larger sectional area than the section of the 1.0 mm diameter conductor with virtually no change to the characteristic impedance of the slabline, ensuring good contact with the ground conductor 61 and with the slabline center conductor. The top of the center conductor 63 and the connecting portion 61a can be configured for engagement, and the contact surfaces of both parts can be enlarged to ensure the contact is stably maintain. Similarly, the center conductor 63 and connecting portion 61a can be soldered together, or the center conductor 63 and ground conductor 61 formed as one unit. The spacing between the parallel ground conductor plates 61b was 2.3 mm, the same as the spacing between the slabline ground plates of the tuner 41.

The tip of the center conductor 63 was machined into a concave shape to ensure that electrical contact was maintain with the slabline center conductor even during horizontal movement of the short-circuit stub probe 60. To ensure stable motion of the stub probe 60, a pair of thin strips were adhered to the top surfaces of the slabline parallel ground conductor plates 61a of the tuner 35, along which the stub probe 60 could slide.

Figure 7:
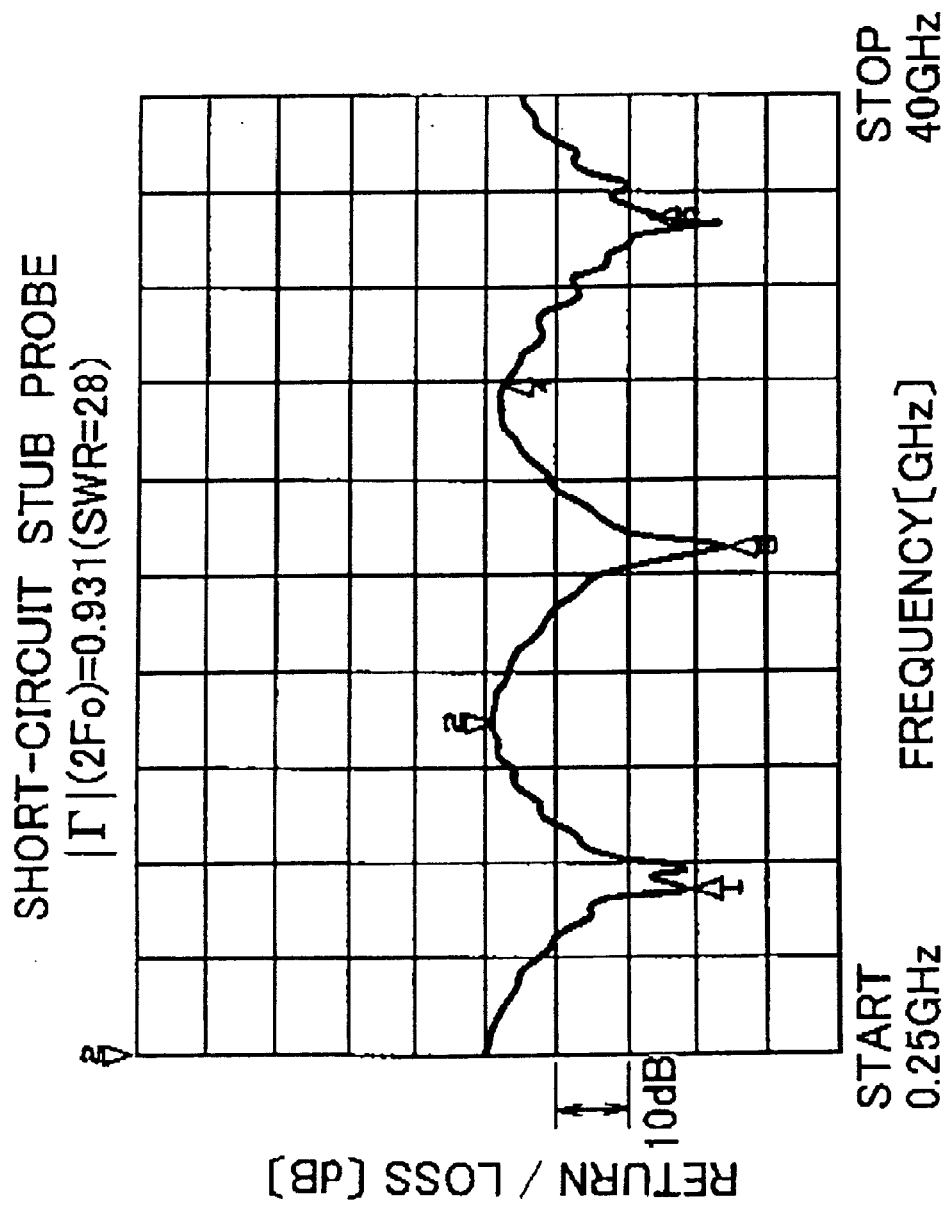
FIG. 7 shows the return loss of a slabline with a short-circuit stub probe as a function of frequency.

FIG. 7 shows the return loss characteristic of the slabline loaded with the short-circuit stub probe 60 as a function of frequency, measured using a Hewlett-Packard HP8510C vector network analyzer. The absolute value of the reflection coefficient at the doubled frequency of 14.0 GHz was 0. 931, a standing wave ratio of 28. The return loss with respect to the fundamental frequency was suppressed to lower than −25 dB. The results show that the short-circuit stub probe 60 thus configured satisfies the short-circuit condition with respect to the second-harmonic signal, and the open condition with respect to the fundamental signal, and therefore hi no affect on the characteristic impedance (50 ohms) of the main slabline circuit. These are good characteristics that are in accordance with the design specifications.

Figure 8:
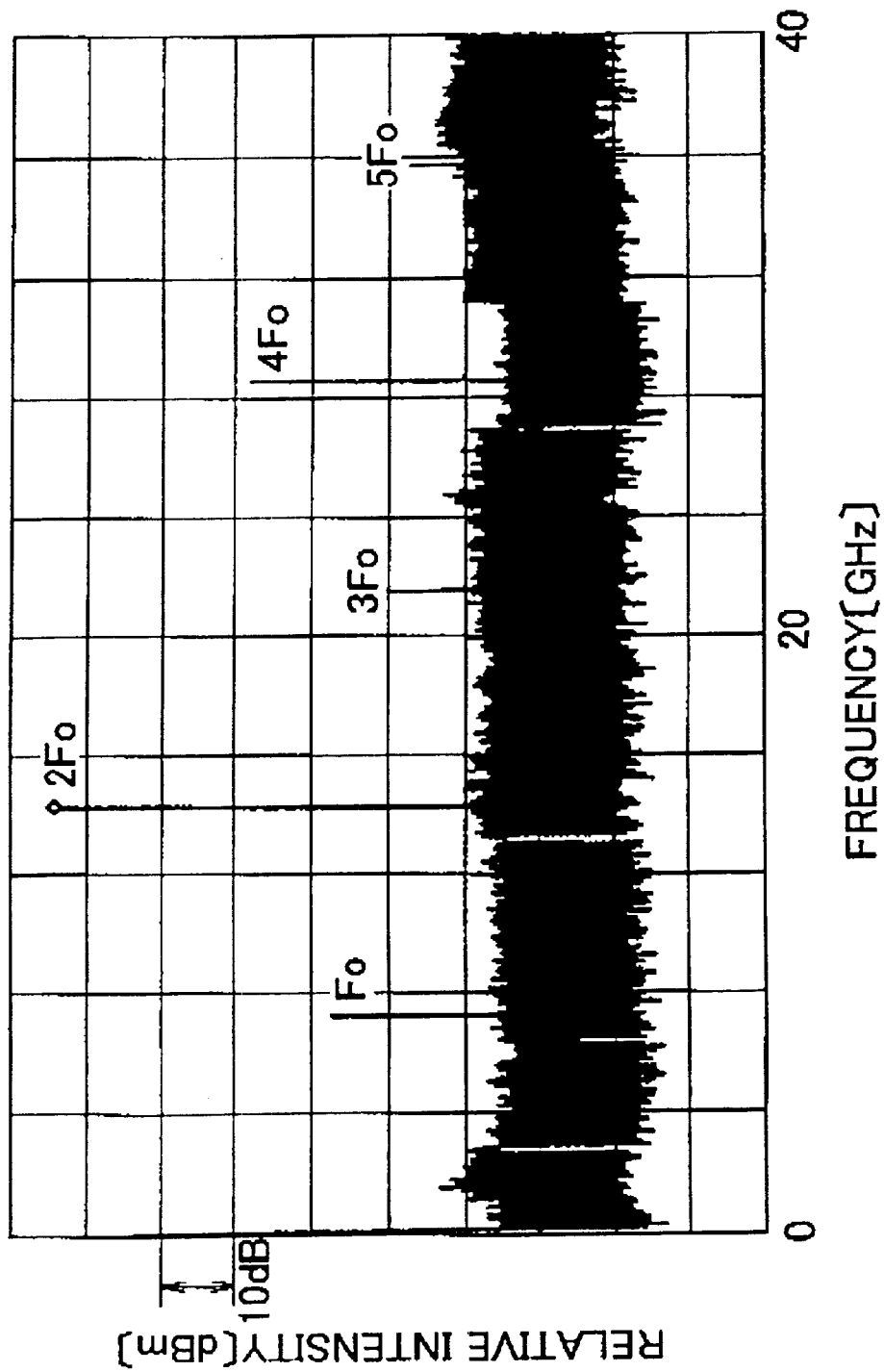
FIG. 8 shows the frequency spectrum of the output signal from a device under test using a mechanical tuner loaded with an open-ended,stub probe.

FIG. 8 shows a frequency spectrum of the output signal of the device under test (DUT) 2 given an optimum fundamental load impedance by using the mechanical tuner 41 loaded with the open-ended stub probe 50; the input frequency was 7.125 GHz and the input power was 6.4 dB. The measurements were performed with the slugs on both the source and load sides set for a through state (50 ohms). FIG. 8 indicates that the second and the fourth harmonic signals could be extracted with high efficiency. It also exhibits that the fundamental frequency component is suppressed to −34 dB compared to the second harmonic (−36.5 dB after correcting for the frequency dependency of the loss in the measurement system on the load side). These results demonstrate, that the open-ended stub probe 50 thus configured function well, as designed, with respect to the operation of the DUT 2.

Figure 9A:
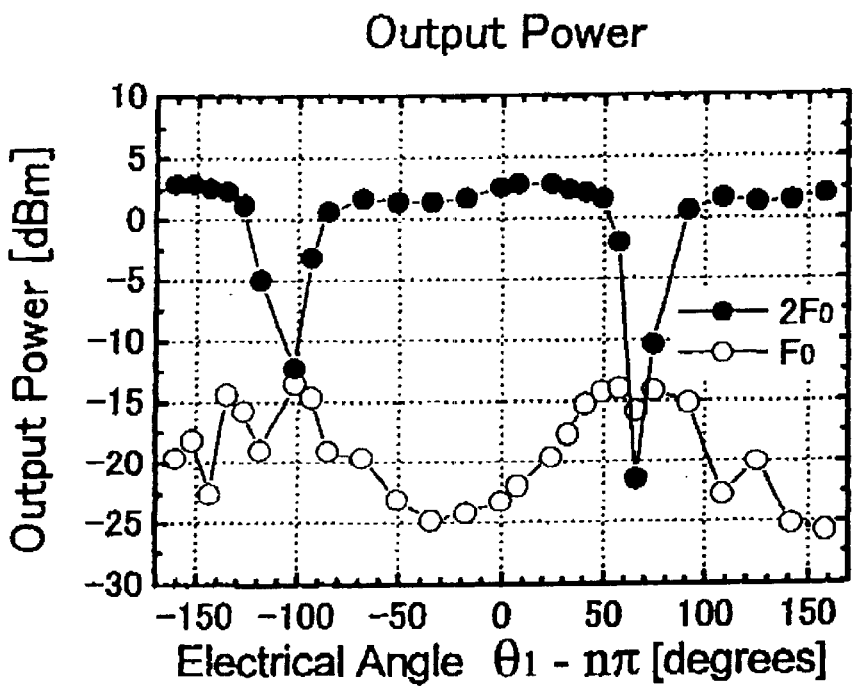
FIG. 9(a) shows the output power characteristic of a device under test, relative to the position of an open-ended stub probe, shown as a function of the electrical angle from the device drain.
Figure 9B:
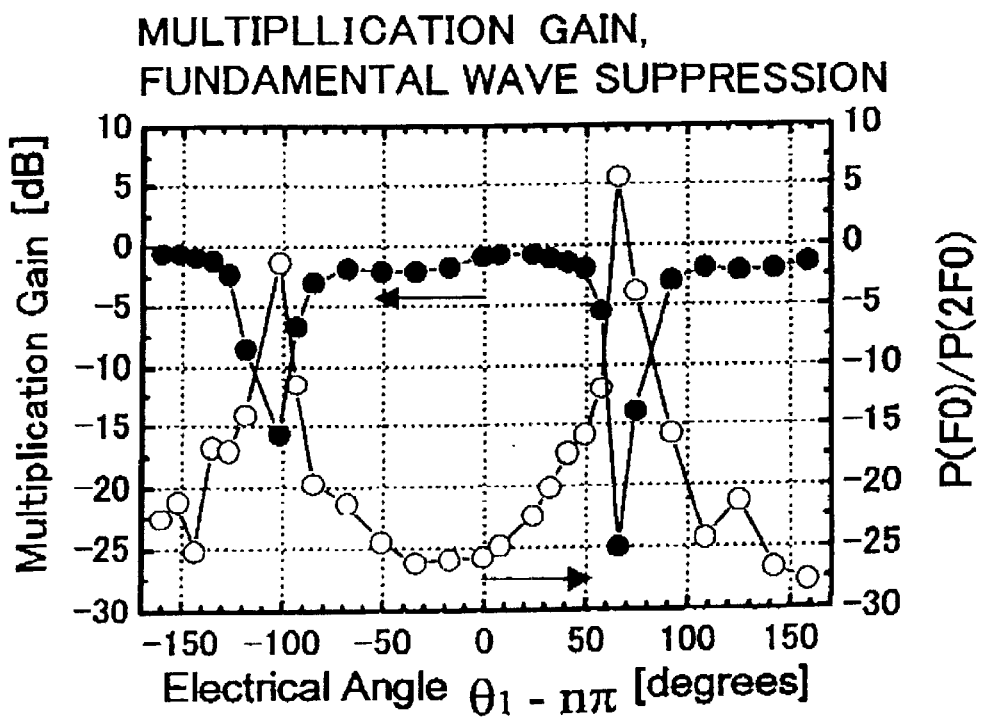
FIG. 9(b) shows the multiplication gain of the device and the fundamental signal suppression characteristic compared to the second harmonic relative to the position of an open-ended stub probe, shown as a function of the electrical angle from the device drain.

FIG. 9($a$) shows the output power characteristics of the DUT 2, relative to the position of the open-ended stub probe 50, expressed as function $\theta1-n\pi$ (n being a natural number), using the electrical angle $\theta1$ from the device drain. The measurements were performed with the slugs on both the source and load sides set for a through state (50 ohms) and no short-circuit stub probe loaded on the source mechanical tuner 35; the input frequency was 7.125 GHz and the input power was 3.5 dB. The reflection coefficient phase angle, as viewed from the probe head, was measured at the fundamental frequency and the shift relative to the short-circuit condition used to find the electrical angle corresponding to each position of the stub probe 50. As shown in FIG. 9($a$), the second-harmonic and fundamental output powers were observed to vary with a period of approximately 180 degrees. FIG. 9($b$) shows optimum multiplication gain and fundamental signal suppression for specific electrical angles. These results form data on the parameters in large-signal operation of the DUT 2, which will be usefully employed to design high-performance frequency multipliers.

Measured values of the input power and the second-harmonic output power and the like shown in FIG. 9 were obtained at the output terminal of the DUT 2 and corrected to compensate for the insertion loss arising in the source and load measuring systems 3 and 4. The correction was implemented by a common technique involving obtaining the insertion loss of the source and load measuring systems by using a network analyzer to separately measure the S parameters of the overall components inserted into each measuring system, including the source or load tuners (fitted with the open-ended stub probe 50, in the case of the load side). Specifically, network analyzer cabling was reconfigured between the signal source 31 and the directional coupler 32, and between the bias T 42 and the spectrum analyzer 43, to obtain the insertion loss of each measuring system in accordance with a series of calibration steps. Circuit route switchers can be provided at two locations at which signals are routed to the network analyzer, to enable routings to be readily switched.

Figure 10:
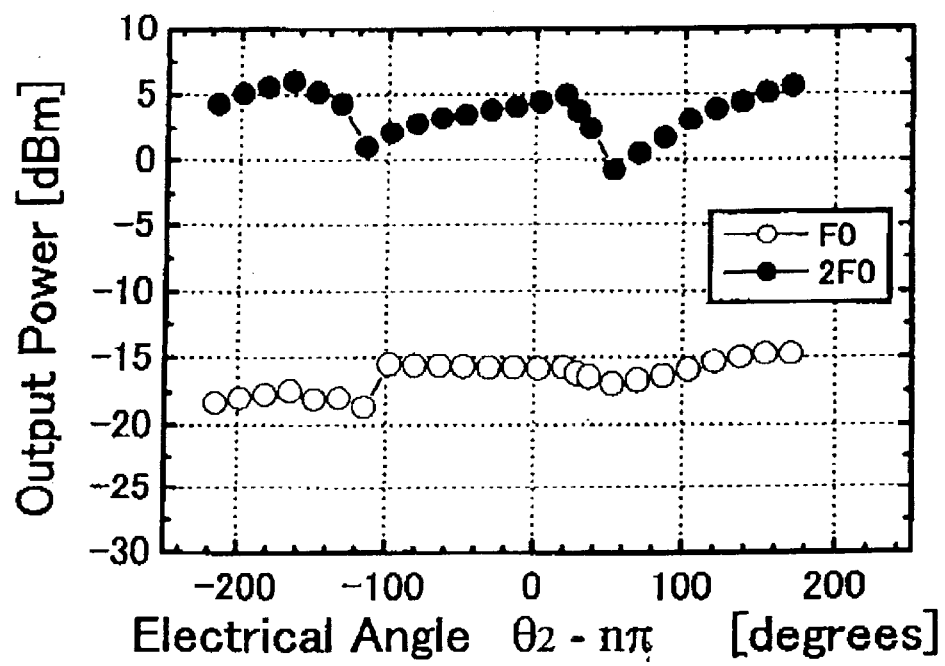
FIG. 10 shows the output power characteristic of a device under test, relative to the position of a short-circuit stub probe, shown as a function of the electrical angle from the device gate.

FIG. 10 shows the output power characteristics of the DUT 2, relative to the position of the short-circuit stub probe 60, expressed as function $\theta2-n\pi$ (n being a natural number), using the electrical angle $\theta2$ from the device drain. For the measurements, the open-ended stub probe of the load tuner 41 was set at a position that produces an electrical angle $\theta1$ of−144 degrees, and the slugs on both the source and load sides were set for a through state. The second-harmonic output power was observed to vary with a period of approximately 180 degrees. At an $\theta2$ of−165 degrees, the second-harmonic output power increased by 3.4 dB. In these measurements too, the input frequency was 7.125 GHz and the input power was 3.5 dB. The insertion loss arising in the source and load measuring systems 3 and 4 was corrected, using the same procedure described above except that the insertion loss of the source measuring system 3 was measured with the short-circuit stub probe 60 on the source mechanical tuner 35.

Load-pull and sourcepull were then perfomed by adjusting the slug positions of the load and source tuners, with the open-ended stub probe 50 and short-circuit stub probe 60 set at the op positions. By using settings on the load side to produce a second harmonic load impedance ZL (2F0) of 68.5 ohms+j32.6 ohms and on the source side to produce a fundamental signal source impedance ZS (0F) of 18.8 ohms+j1.05 ohms, an increase of 3.0 dB in the second harmonic output was observed. Since no correction for loss in either tuner was performed, it can be concluded that for the DUT 2, it is possible to realize a second harmonic output of at least 9.0 dBm, at least 5.5 dB in terms of multiplication gain This shows that harmonic load-pull for frequency multiplication is feasible with the above procedure.

Figure 11:
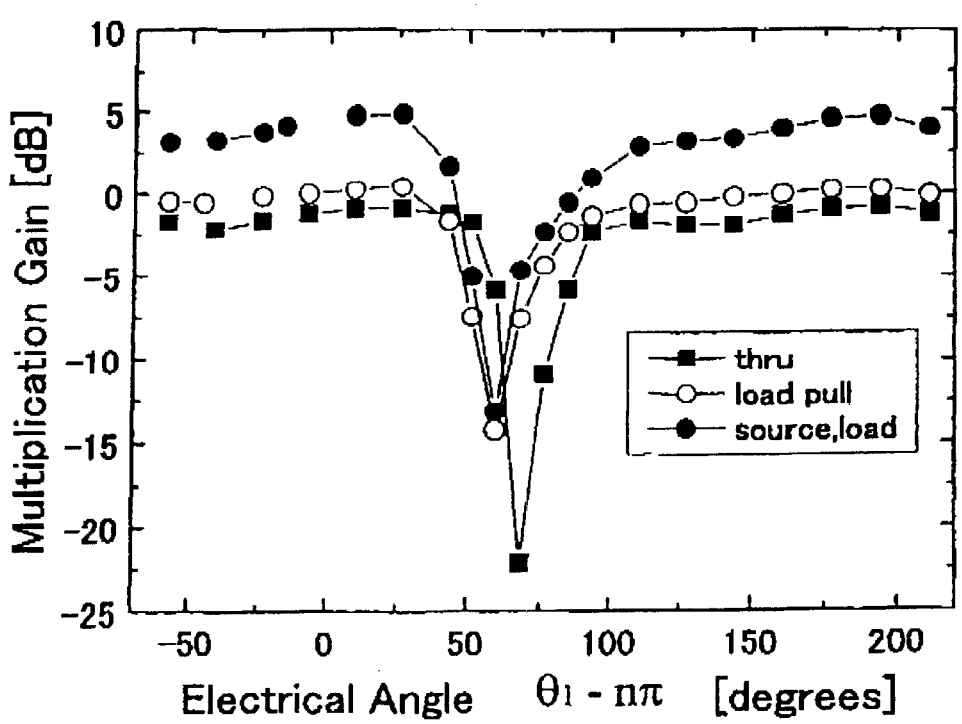
FIG. 11 is a characteristic diagram of the device multiplication gain characteristic relative to the position of an open-ended stub probe in load-pull and source-pull states set by slug position, shown as a function of the electrical angle from the device drain.

FIG. 11 shows how gain changes when the electrical angle $\theta1$ of the open-ended stub probe 50 is changed, with the slugs set to perform load-pull and source-pull. These gain change characteristics are shown in terms of the dependency on the slug position setting on the source and load sides. In the figure, the closed squares denote changes in the electrical angle $\theta1$ of the open-ended stub probe 50 when slugs on the source and load sides are set to the through state (50 ohms); the open circles denote changes in the electrical angle $\theta1$ of the open-ended stub probe 50 when the slug in the load tuner is set to produce a second harmonic load impedance ZL (2F0) of 68.5 ohms+j32.6 ohms and the slug in the source tuner is set to the through state (50 ohms); and the closed circles denote changes in the electrical angle $\theta1$ of the open-ended stub probe 50 when the slug in the load tuner is set to produce a second harmonic load impedance ZL (2F0) of 68.5 ohms+j32.6 ohms and the slug in the source tuner is set to produce a fundamental source impedance ZS (F0) of 18.8 ohms+j1.05 ohms. ZL (2F0) and ZS (F0) are values selected beforehand to improve frequency doubling gain by using just the slugs, i.e., without loading the slabline with open-ended or short-circuit stub probes. The figure indicates that the three curves exhibit the same electrical angle dependency with difference only in the gain values. This result shows that control of the fundamental load impedarce using the open-ended stub probe 50 is independent from load-pull and source-pull which are based on slug position setting. In these measurements too, the input frequency was 7.125 GHz and the input power was 3.5 dB. The correction procedure described above was used to correct measured values for insertion loss arising in the source and load measuring systems 3 and 4, with the short-circuit stub probe 60 mounted on the source tuner 35 and the open-ended stub probe 50 mounted on the load tuner 41.

Figure 12:
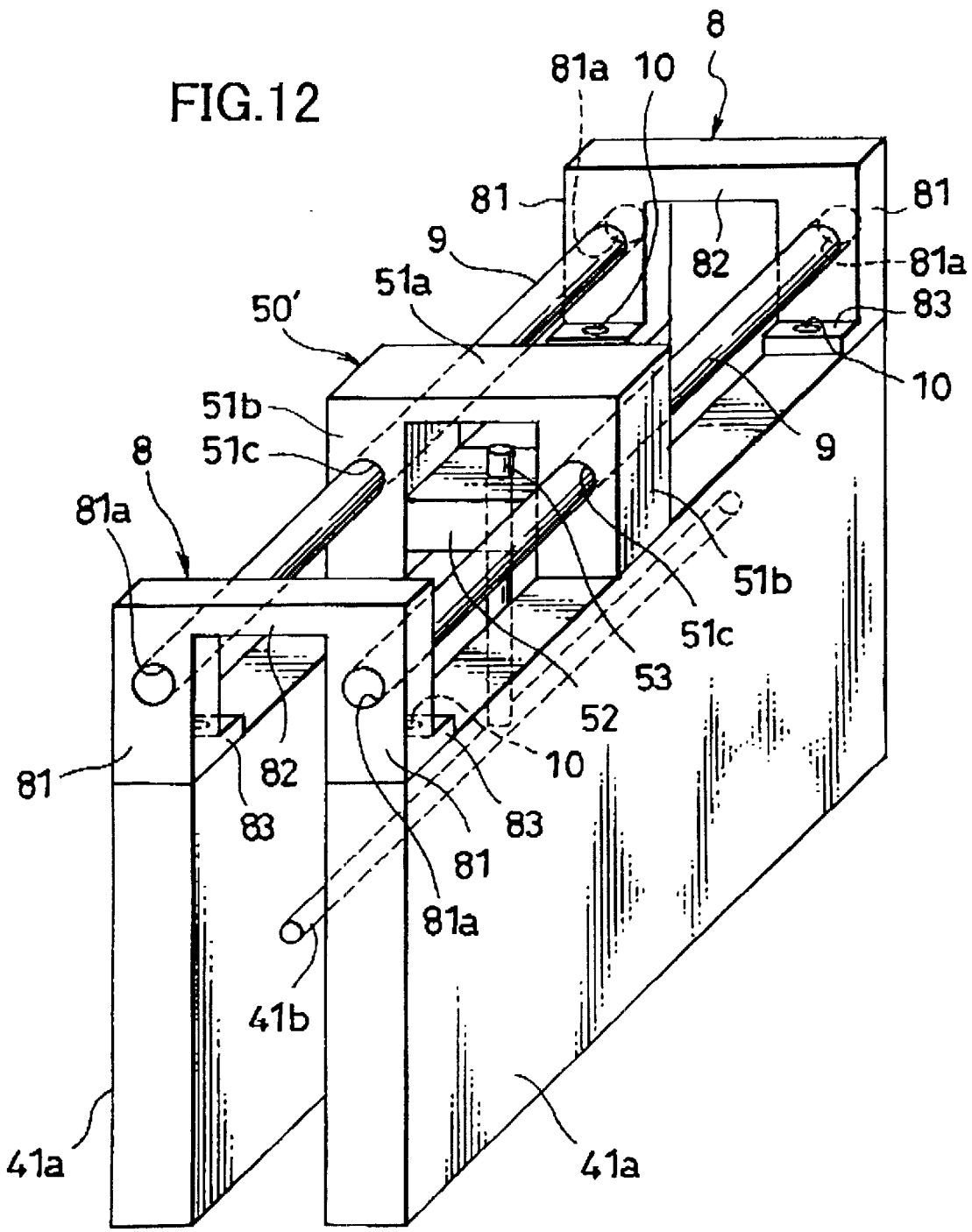
FIG. 12 is a perspective view of a configuration for facilitating horizontal sliding motion of an open-ended or short-circuit stub probe mounted on the slabline of a mechanical tuner.
Figure 13:
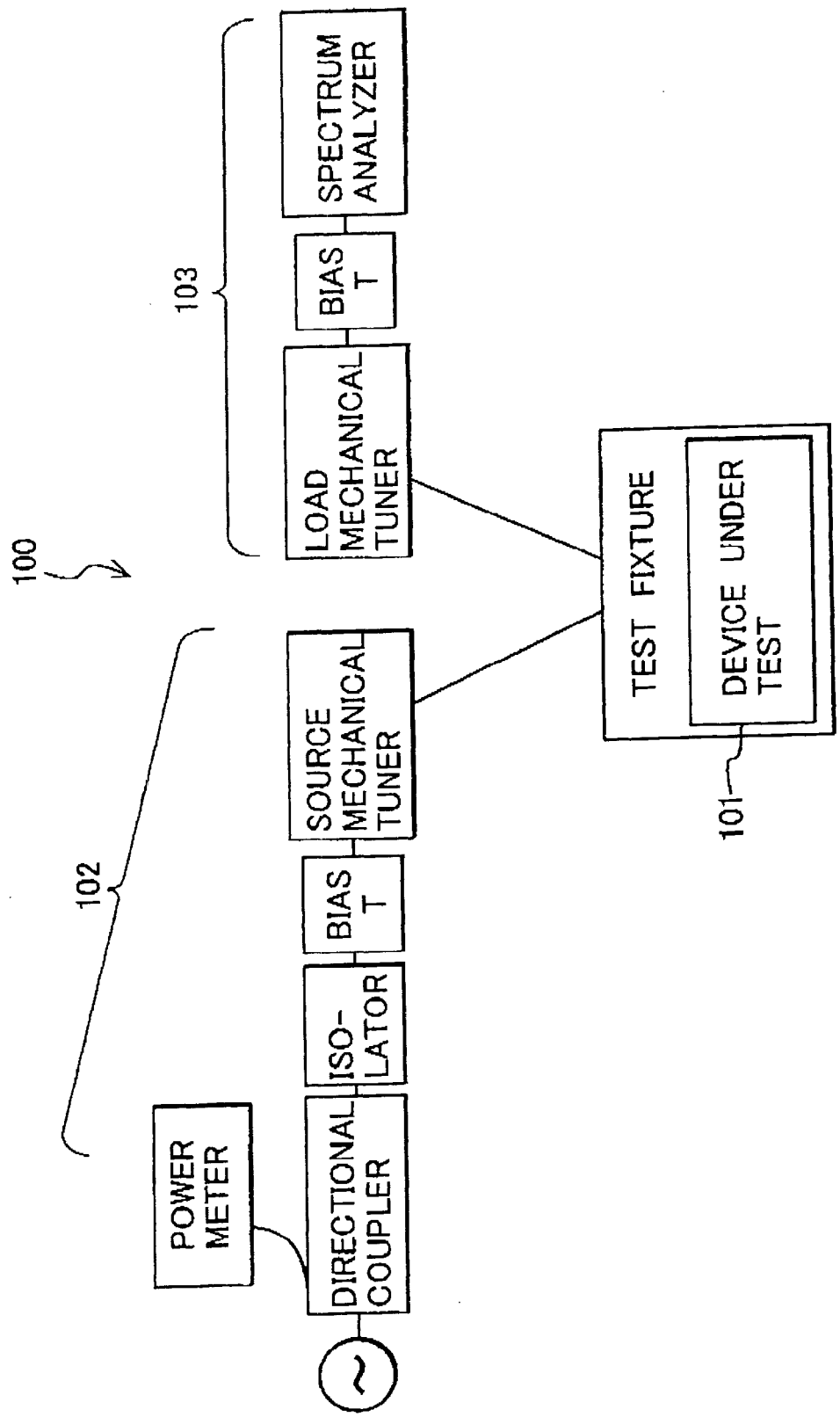
FIG. 13 is a diagram of the overall configuration of a prior art load-pull measurement apparatus.

Apparatus 1' for measuring harmonic load-pull for frequency multiplication, which was used to obtain the above type of results, was provided with guide rails to facilitate sliding movement of the open-ended stub probe 50. and short-circuit stub probe 60 on the slabline ground conductor plates 41a of the tuners 41 and 35. However, means for facilitating the sliding motion are not limited thereto, and can be achieved through various known methods. FIG. 12, for example, shows a structure that can be provided on the slabline ground conductor plates to enable mechanically stabilized sliding motion of the slug probes.

FIG. 12 shows a slide-guide arrangement provided on a load tuner 41 that has an open-ended stub probe 50. Each of the parallel ground conductor plates 51b of open-ended stub probe 50' is provided with a through-hole 51c, support members 8 are provided at each end of the pair of parallel ground conductor plates 41a, and guide rails 9 are inserted through the through-holes 51c. This enables the open-ended stub probe 50' to be slid along the ground conductor plates 41a while contact is maintained between the center conductor 53 of the open-ended stub probe 50 and the center conductor 41b of the slabline.

The support members 8 can be formed of aluminum, for example, to be configured as a pair of support portions 81 positioned on the top edge of the ground conductor plates 41a, with each support portion 81 having an end support hole 81a for supporting the ends of the guide rails 9, and each pair of support portions 81 being connected at their upper ends by a connecting portion 82. Fixing portions 83 are provided at the bottom of the support members 8. These fixing portions 83 extend out along the top edges of the ground conductor plates 41a, to which they are affixed by screws 10.

The guide rails 9 are round and made of precision-machined stainless steel to reduce friction with the sliding motion of the guide holes 51c. While the shape of the guide rails is not limited to the round shape of the guide rails 9, a round shape is advantageous in that it simplifies fabrication by using round holes throughout. The end support holes 81a can be formed as through holes, and then provided with means retain the guide rails 9 in place. The support members can also be formed with end support grooves to both support and retain the guide rails 9.

As described in the foregoing, in accordance with the method of this invention for measuring harmonic load-pull for frequency multiplication, the fundamental load impedance in a load mechanical tuner is set to the optimum level by a control means that functions as an open-ended stub that is one-quarter wavelength long at the fundamental frequency and which at that position satisfies a short circuit condition with respect to the fundamental signal, for controlling a fundamental load impedance and that in accordance with a position at which the stub is set determines an electrical angle from the output section of the device under measurement to the short-circuit point, in which state it becomes possible to use a slug to adjust the even-order harmonic load impedance to an optimum level. Moreover, the even-order harmonic source impedance in the source mechanical tuner is optimized by a control means that fictions as a short-circuit stub that is one-quarter a fundamental wavelength long, and which at that position satisfies a short-circuit condition with respect to even-harmonics that includes a second harmonic signal, for controlling an even-harmonic source impedance that in accordance with a position at which the stub is set determines an electrical angle from an input section of the device under measurement to the short-circuit point, in which state it becomes possible to use a slug to control the fundamental source impedance. Conversely, it becomes to use a slug to optimize the even-harmonic load impedance in the load-side mechanical tuner and, in that state, for the fundamental wave load impedance to be controlled. It also becomes possible to use a slug to optimize the fundamental signal source impedance in the source-side mechanical tuner and, in that state, for the even-harmonic source impedance to be controlled. That is, in the source and load mechanical tuners, the input and output impedances at the fundamental and even-harmonic frequencies respectively can independently be controlled, thereby enabling even-harmonic load-pull measurement for even-order frequency multiplication (especially frequency doubling).

Moreover, in accordance with the method of the invention for measuring harmonic load-pull for frequency multiplication, it is possible to exploit measurements to directly and readily find the frequency multiplication limits of subject devices. In the selection of the optimum devices to be used in the development of frequency multipliers, this technique can be used to establish beforehand variations from lot to lot and differences between properties of devices in the same lot arising from such factors as differences in gate width, for example, as well as to compare device differences arising from the use of different processes. Device characteristics under assumed large-signal operating conditions can be directly measured, helping to design higher-accuracycircuits.

The apparatus of this invention that uses the above method to measure harmonic load-pull for frequency multiplication, has a load-side measuring system mechanical tuner with a control means that functions as an open-ended stub that is one-quarter wavelength long at the fundamental frequency and which at that position sates a short-circuit condition with respect to the fundamental signal, for controlling a fundamental load impedance and that in accordance with a position at which the stub is set determines an electrical angle from the output section of the device under measurement to the short-circuit point; and a source-side measuring system mechanical tuner with a control means that functions as a short-circuit stub that is one-quarter wavelength long at the fundamental frequency and which at that position satisfies a short-circuit condition with respect to the even-harmonics, including a second harmonic signal, for controlling an even-harmonic source impedance and that in accordance with a position at which the stub is set determines the electrical angle from the input section of the device under measurement to the short-circuit point. This makes it possible to use a slug to adjust the fundamental load impedance in the load-side mechanical tuner to an optimum level. Moreover, it also becomes possible to use a slug to control the fundamental source impedance with the even-harmonic source impedance in the source mechanical tuner set to an optimum level. It also becomes possible to use a slug to optimize the even-order multiplied wave load impedance in the load mechanical tuner and, in that state, to control the fundamental load impedance. It also becomes possible to use a slug to optimize the fundamental source impedance in the source-side mechanical tuner and, in that state, to control the even-harmonic source impedance. That is, in the source and load mechanical tuners, the input and output impedances of the fundamental and even-harmonics can independently be controlled, enabling an apparatus to be provided that performs even-harmonic load-pull measurement for even-order frequency multiplication (particularly for frequency doubling).

Moreover, in accordance with the method of the invention for measuring harmonic load-pull for frequency multiplication, it is possible to exploit measurements to directly and readily find the frequency multiplication limits of subject devices. In the selection of the optimum devices to be used in the development of frequency multipliers, this technique can be used to establish beforehand variations from lot to lot and differences between properties of devices in the same lot arising from such factors as differences in gate width, for example, as well as to compare device differences arising from the use of different processes. Device characteristics under assumed large-signal operating conditions can be directly measured, helping to design high-performance circuits.

What is claimed is:

1. A method for measuring harmonic load-pull for frequency multiplication to obtain a load impedance and a source impedance for which frequency multiplication performance of a frequency multiplication device is optimized, said method comprising:

supplying a fundamental frequency signal to a frequency multiplication device under test from a source measurement system that includes a source mechanical tuner for adjusting a fundamental source impedance of an input signal, and obtaining a target even-order multiplied frequency at which multiplication performance of the frequency multiplication device is optimum from a load measurement system that includes a load mechanical tuner for adjusting a device load impedance at the target even-order multiplied signal that is among a signal output of the frequency multiplication device;

independently controlling fundamental load impedance and even-harmonic load impedance by means of a load mechanical tuner that includes a control means that functions as an open-ended stub that is one-quarter wavelength long at the fundamental frequency and which at that position satisfies a short-circuit condition with respect to the fundamental signal, for controlling a fundamental load that depends on a position at which the stub is set and that is represented by an electrical angle from an output section of a device under test to a short-circuit point;

independently controlling fundamental source impedance and even-harmonic source impedance by means of a source mechanical tuner that includes control means that functions as a short-circuit stub that is one-quarter wavelength long at the fundamental frequency, and therefore a half wavelength long at the second harmonic frequency, and which at that position satisfies a short-circuit condition with respect to even-harmonics that include a second harmonic signal, for controlling an even-harmonic source impedance that depends on a position at which the stub is set and that is represented by an electrical angle from an input section of a device under test to the short-circuit point.

2. An apparatus for measuring harmonic load-pull for frequency multiplication to obtain a load impedance and a source impedance at which frequency multiplication performance of a frequency multiplication device is optimized, said apparatus comprising:

a source measuring system that supplies a fundamental frequency signal to a frequency multiplication device under test from a source measurement system that includes a source mechanical tuner for adjusting a fundamental source impedance of an input signal, and a load measurement system that includes a load mechanical tuner for adjusting a load impedance of a target even-order harmonic signal among harmonics included in a signal output of the frequency multiplication device;

said load mechanical tuner of said load measuring system including control means that functions as an open-ended stub that is a quarter wavelength long at the fundamental frequency and which at that position satisfies a short-circuit condition with respect to the fundamental signal and in accordance with a position at which the stub is set determines an electrical angle from an output section of a device under test to a short-circuit point;

said source mechanical tuner of said source measuring system including control means that functions as a short-circuit stub that is one-quarter wavelength long at the fundamental frequency, and therefore a half wavelength long at the second harmonic frequency, and which at that position satisfies a short-circuit condition with respect to even harmonics that include a second harmonic signal, for controlling an even-harmonic source impedance that depends on a position at which the stub is set and that is represented by an electrical angle from an input section of a device under test to a short-circuit point;

said load mechanical tuner being used to independently control fundamental signal load impedance and even-harmonic load impedance, and said source mechanical tuner being used to independently control fundamental source impedance and even-harmonic source impedance.

3. A method for measuring harmonic load-pull for frequency multiplication, comprising:

supplying a fundamental frequency signal to a frequency multiplication device under test from a source measurement system that includes a source mechanical tuner configured to adjust a fundamental source impedance of an input signal, and obtaining a target even-order multiplied frequency at which a multiplication performance of the frequency multiplication device is optimum from a load measurement system that includes a load mechanical tuner configured to adjust a device load impedance at the target even-order multiplied signal that is among a signal output of the frequency multiplication device;

independently controlling a fundamental load impedance and an even-harmonic load impedance with a load mechanical tuner that includes a load control unit that comprises an open-ended stub that is one-quarter wavelength long at the fundamental frequency and which satisfies a short-circuit condition with respect to the fundamental signal, the load control unit configured to control the fundamental load impedance that depends on a position at which the stub is set and that is represented by an electrical angle from an output section of a device under test to a short-circuit point; and independently controlling a fundamental source impedance and an even-harmonic source impedance with a source mechanical tuner that includes a source control unit that comprises a short-circuit stub that is one-quarter wavelength long at the fundamental frequency and therefore a half wavelength long at the second harmonic frequency, and which satisfies a short-circuit condition with respect to even-harmonics that include a second harmonic signal, the source control unit configured to control an even-harmonic source impedance that depends on a position at which the stub is set and that is represented by an electrical angle from an input section of the device under test to the short-circuit point.

4. An apparatus configured to measure harmonic load-pull for frequency multiplication, comprising:

a source measuring system that supplies a fundamental frequency signal to a frequency multiplication device under test from a source measurement system that includes a source mechanical tuner configured to adjust a fundamental source impedance of an input signal, and a load measurement system that includes a load mechanical tuner configured to adjust a load impedance of a target even-order harmonic signal among harmonics included in a signal output of the frequency multiplication device;

said load mechanical tuner of said load measuring system includes a load control unit that comprises an open-ended stub that is one-quarter wavelength long at the fundamental frequency and which satisfies a short-circuit condition with respect to the fundamental signal, and based on a predetermined position at which the stub is set the load control unit is configured to determine an electrical angle from an output section of a device under test to a short-circuit point;

said source mechanical tuner of said source measuring system includes a source control unit that comprises a short-circuit stub that is one-quarter wavelength long at the fundamental frequency and half wavelength long at the second harmonic frequency, and which satisfies a short-circuit condition with respect to even-harmonics that include a second harmonic, the source control unit is configured to control an even-harmonic source impedance that depends on a position at which the stub is set and that is represented by an electrical angle from an input section of the device under test to the short-circuit point; and said load mechanical tuner is used to independently control a fundamental signal load impedance and an even-harmonic load impedance and said source mechanical tuner is used to independently control a fundamental source impedance and an even-harmonic source impedance.

* * * * *

UNITED STATES PATENT AND TRADEMARK OFFICE
CERTIFICATE OF CORRECTION

PATENT NO.    : 6,515,465 B2
DATED         : February 4, 2003
INVENTOR(S)   : Kiyokawa et al.

It is certified that error appears in the above-identified patent and that said Letters Patent is hereby corrected as shown below:

<u>Title page,</u>
Item [73], Assignee should read:

-- [73]  Assignee: Communications Research Laboratory, Independent Administrative Institution, Koganei (JP) --

Item [30], Foreign Application Priority Data should read:

-- [30]        Foreign Application Priority Data

Mar. 22, 2000   (JP) ………………….. 2000-080839
        Jan. 16, 2001    (JP) ………………….. 2001-008064 --

Signed and Sealed this

First Day of July, 2003

JAMES E. ROGAN
*Director of the United States Patent and Trademark Office*